United States Patent [19]

Hodgson et al.

[11] Patent Number: 5,047,649

[45] Date of Patent: Sep. 10, 1991

[54] METHOD AND APPARATUS FOR WRITING OR ETCHING NARROW LINEWIDTH PATTERNS ON INSULATING MATERIALS

[75] Inventors: Rodney T. Hodgson, Ossining; Jackson E. Stanland, Waccabuc; Oliver C. Wells, Yorktown Heights, all of N.Y.

[73] Assignee: International Business Machines Corporation, Armonk, N.Y.

[21] Appl. No.: 594,269

[22] Filed: Oct. 9, 1990

[51] Int. Cl.[5] .......................................... H01J 37/317
[52] U.S. Cl. ................................ 250/492.2; 250/306; 250/307; 250/492.3
[58] Field of Search ................... 250/492.2, 306, 307, 250/492.3; 156/625, 643

[56] References Cited

U.S. PATENT DOCUMENTS

| | | | |
|---|---|---|---|
| 4,316,093 | 2/1982 | Broers et al. | 250/492.2 |
| 4,343,993 | 8/1982 | Binnig et al. | 250/306 |
| 4,422,002 | 12/1983 | Binnig et al. | 310/328 |
| 4,550,257 | 10/1985 | Binnig et al. | 250/492.2 |
| 4,668,865 | 5/1987 | Gimzewski et al. | 250/306 |
| 4,724,318 | 2/1988 | Binnig | 250/306 |
| 4,785,189 | 11/1988 | Wells | 250/492.2 |
| 4,823,004 | 4/1989 | Kaiser | 250/306 |
| 4,907,195 | 3/1990 | Kazan et al. | 250/306 |

OTHER PUBLICATIONS

"Fast Scan Piezo Drive", IBM Technical Disclosure Bulletin, vol. 27, #10B, Mar. 1985, p. 5976, G. K. Binnig et al.
"Sound and Vibration Insulation for Sensitive Apparatus", IBM Technical Disclosure Bulletin, vol. 27, #5, p. 3137, G. K. Binnig et al., Oct. 1984.

Primary Examiner—Jack I. Berman
Assistant Examiner—Kiet T. Nguyen
Attorney, Agent, or Firm—John J. Goodwin

[57] ABSTRACT

A method and apparatus for producing fine line patterns on insulating surfaces utilizing a conductive spring-like cantilever having a pointed tip which is in proximity to the surface to be affected. Electrons emitted from the tip travel toward the insulator surface and cause changes therein or affect molecules located in the proximity of the insulator surface. Tunneling current is not required, and a highly conducting return current path for electrons through the insulator is not necessary. The incident electrons can be used to provide patterned, narrow-width features either by deposition of a material onto the insulator surface, or by producing etching in localized regions of the insulator surface, or by changing the insulator surface so that it can be etched.

20 Claims, 2 Drawing Sheets

METHOD AND APPARATUS FOR WRITING OR ETCHING NARROW LINEWIDTH PATTERNS ON INSULATING MATERIALS

FIELD OF THE INVENTION

This invention relates to an apparatus and method for providing very narrow linewidth patterns of deposited material on, or etched regions in, an insulating substrate, and more particularly to such a technique in which narrow linewidth features can be provided by using a very fine tip without the need for a highly conductive material in the substrate.

BACKGROUND OF THE INVENTION

Conventional lithographic techniques are well known in the manufacture of miniaturized electronic and magnetic circuits. In particular, photoresist layers are often used, where the photoresist layer is pattern-wise exposed and developed to provide a pattern which is then used for the deposition of a material or etching of the substrate on which the photoresist layer is located. The resolution obtainable in these photolithographic processes is limited by diffraction effects, which are in turn related to the wavelength of the light used in the exposure step.

In order to increase resolution, electron beam lithography is used. In this type of lithography, a deposited electron-sensitive resist layer is pattern-wise exposed, typically using an electron beam which is scanned across the resist layer and is turned on and off so as to form the desired exposure image in the resist layer. The resist is then developed in a manner similar to that used in photolithography. In electron beam lithography, resolution is limited primarily either by electron scattering effects in the material being radiated or by the diameter of the electron beam (if the beam diameter is too large). In particular, tightly focussed beams are provided by increasing the voltages that are used; however, increased energy beams lead to an increased energy of backscattered electrons, which have greater ranges and expose greater volumes of material. This in turn clouds the image produced by the electron beam exposure.

While it has been recognized in theory that electron scattering effects may be reduced by lowering the energy of the electrons in an electron beam, the minimum achievable beam diameter in conventional electron beam machines increases as the energy of the electrons in the beam is reduced. This occurs due to chromatic aberration in the magnetic and/or electronic lenses of such such apparatus, among other causes. Consequently, as the energy of the electrons in a conventional electron beam apparatus is reduced, the resolution actually deteriorates rather than improves because of the increasing beam diameter.

The need for high performance integrated devices and for further miniaturization has led to an improvement in providing such devices and circuits, as described in U.S. Pat. No. 4,785,189 by Oliver C. Wells, assigned to the present assignee. That reference recognizes that solutions to these two problems are not readily consistent since, if one of the resolution-limiting problems is corrected, the other is worsened. In order to overcome this, the reference utilized a different apparatus for providing a very narrow electron beam, the apparatus being a pointed tip from which electrons are emitted. Since the provision of a very narrow electron beam is achieved without large focussing voltages, the energies of electrons in the beam from the pointed tip are very small. This in turn solved the backscattering problem.

While a pointed tip or stylus is used in U.S. Pat. No. 4,785,189, such a technique and apparatus requires that the substrate contain a conductive layer in order to provide a return path for the tunneling current that is used to expose the electron-sensitive material. However, in the fabricaiton of many devices and circuits, substrates do not containn a conductive layer. Even if a conductive layer is present the insulating layer, which must be exposed, is often too thick to allow the passage of low energy electrons therethrough. Thus, while U.S. Pat. No. 4,785,189 is very useful for the exposure of very thin electron-sensitive resist layers or resist layers having a conductive layer located thereover, such a technique cannot be used where no highly conductive return path is provided for the tunneling electron current from the pointed tip, or stylus.

In a typical scanning tunnelling microscope (STM), a voltage of 0.1-1 volts is applied between the electron emitting tip and the conducting substrate, which is sufficient to drive a current in the nanoamp range continuously through the circuit. For a less highly conducting substrate return path, the currents are too weak to use to adjust the tip-to-substrate distance (Z) accurately. This is particularly apparent when the tip is to be scanned across the insulating substrate. In an STM, the pointed tip may be damaged if it has to be moved in a Z-direction to hunt for the substrate surface and then runs into the substrate surface. To solve this problem, the present invention uses a conductive pointed tip attached to a conducting cantilever to be able to accurately establish the desired tip-to-substrate distance even when the tip is scanned in the X-Y plane across the insulating substrate. This operation is similar to the movement of a pointed tip in an atomic force microscope (AFM) as described in U.S. Pat. No. 4,724,318.

Accordingly, it is a primary object of the present invention to provide an apparatus including a pointed tip and method for producing very narrow linewidths on substrates which do not include highly conductive layers serving as a current return path for electrons from the pointed tip.

It is another object of this invention to provide an apparatus including a pointed tip and method for affecting insulating materials, without the need for providing a highly conducting path through the insulating materials to the apparatus used to affect the insulating material.

It is another object of the present invention to provide an apparatus including a pointed tip, or stylus from which a very narrow beam of electrons can be emitted, and to utilize the narrow beam of electrons to affect an insulating material, there being no highly conductive return current path for said electrons.

It is another object of this invention to provide an apparatus and method for producing very-fine linewidth depositions on a highly insulating material or etched regions in the highly insulating material.

It is another object of the present invention to provide an improved technique which adapts the spatial resolution advantages possible with the use of the pointed tip or stylus to the provision of very narrow linewidth patterns on insulating materials of many thicknesses.

BRIEF SUMMARY OF THE INVENTION

In the practice of this invention, a pointed tip, or stylus, is used to emit electrons which travel to an insulating layer and cause effects thereon, there being no means for providing a highly conductive return current path for the emitted electrons. The pointed tip or stylus is comprised of a conductive material and is connected to a conductive spring or cantilever, which can be moved in X, Y or Z directions with respect to the insulating layer. The insulating layer can also be moved in X,Y and Z directions with respect to the pointed tip, or stylus. The spring or cantilever with the conductive pointed tip is attached to a voltage source for applying either a positive, negative or zero voltage to the pointed tip in order to effect the emission of electrons therefrom. Interferometer or other techniques as known in the art are used to determine the exact position of the pointed tip relative to the insulating layer. Thus, this apparatus has structure similarities to an atomic force microscope. In such an apparatus, a sharp point is brought close to a surface of a sample to be investigated and the forces occuring between atoms at the apex of the point and those at the surface layer cause the spring-like cantilever to deflect. Deflection of the cantilever is monitored as the sharp point is moved across the surface of the layer to be examined. In this manner a topographic or other image of the surface is obtained. In a prepared embodiment of the AFM, the pointed tip is vibrated at high frequencies to increase the signal to noise ratio, thereby increasing the accuracy of the Z-coordinate measurement.

In the present invention, the pointed tip and the spring-like cantilever are comprised of conductive materials so that a voltage can be applied to the pointed tip to cause electron emission therefrom. Since a highly conducting return current path is not required, and since tunnelling into a solid is not required, this invention can be used to provide high resolution depositions on or etched regions in insulating materials, over a wide range of thickness of the insulator.

The electrons ejected from a pointed tip into vacuum tunnel from the material of the tip into the vacuum and are then accelerated in the electric field surrounding the tip. When the electrons land on a surface, they have a range in the material depending on the electron energy. The electrons have a relatively long range at very low energies, which decreases to a minimum of (typically) 0.5 nm at an electron energy typically between 5 and 50 volts, and then increases again so that the range is about 10 nm for electrons of about 5000 volts.

When used in a direct-write mode, a gas capable of being dissociated or decomposed is located between the pointed tip and the insulating substrate or adsorbed on the insulating substrate. As an alternative, the insulating layer can be a resist layer which is electron-sensitive. A highly conducting substrate is not required, and the insulating resist layer or layers can be very thick. Another use of the present invention is for the localized charging of the insulator surface and then the exposure of the charged surface to an oppositely charged gas or particle cloud. Depending upon the gas or particle cloud, material will be deposited in the localized charged areas of the insulator, or these localized charged areas will be etched. Thus, in the practice of this invention, the advantages to be obtained by the very narrow beam width of the electrons emitted from a pointed tip are extended to allow utility with materials which could not heretofore be addressed with such apparatus, viz, insulating materials and particularly those insulating materials having thicknesses in excess of about 10 nm.

The pointed tip in this invention may also be used as a source of positively charged atoms or molecules. A material such as gallium metal may be ionized at the pointed tip and accelerated in the field of the tip to produce a fine ion beam.

These and other objects, features, and advantages will be apparent from the following more particular description of the preferred embodiments.

DESCRIPTION OF THE PREFERRED EMBODIMENTS

Figure 1:
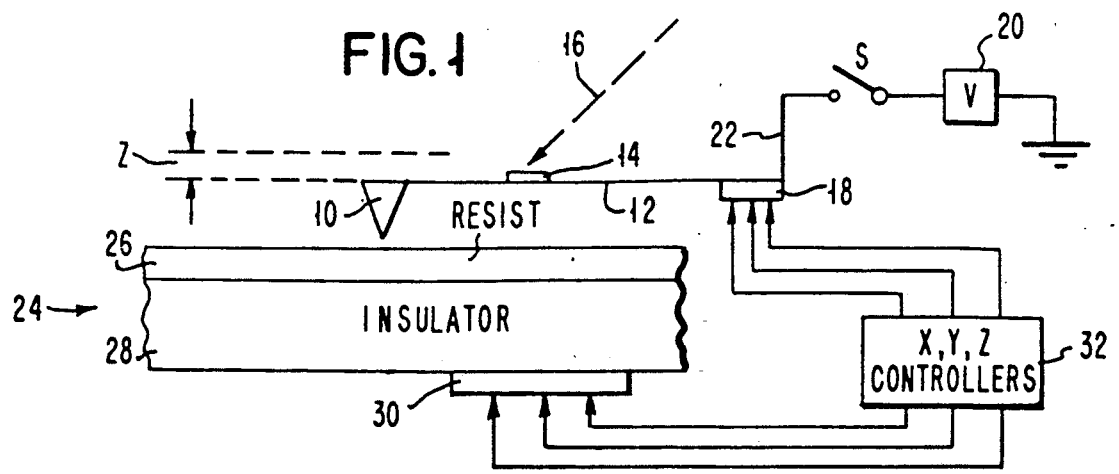
FIG. 1 is a schematic view of an apparatus sufficient to carry out the present invention, the apparatus including a pointed tip or stylus located in close proximity to an insulating substrate.

FIG. 1 illustrates an apparatus which can be used to practice the present invention. This apparatus includes a conductive pointed tip or stylus 10 connected to a spring-like cantilever 12. A small reflective index mark 14 can be optionally provided on the cantilever for use in fine Z-positioning. Using well known interferometric means a light beam, depicted by arrow 16, will be reflected from index mark 14 and can be used to exactly position the cantilever and the pointed tip 10. A piezoelectric member 18, or members, are located on the end of cantilever 12 and are used for X,Y and Z positioning of the pointed tip 10 with respect to the substrate surface. A voltage source 20 is connected via lead 22 to the spring-like cantilever 12. Source 20 can be used to provide positive, negative or zero voltages at the apex of tip 10.

The pointed tip 10 can be moved across the substrate 24 in contact with substrate 24. When the tip is in the desired X-Y position, the pointed tip 10 can be positioned at a set distance above the substrate 24, which in this case is illustrated as a resist layer 26 on a thick insulator layer 28. Resist layer 26 can be any of the well known electron-sensitive resist materials. Piezoelectric member 30, or members, are located behind insulating layer 28, and are used for X,Y and, Z optionally, positioning of the substrate 24. X,Y and Z controllers 32 are connected to piezoelectric members 18 and 30 in order to provide proper positioning of the substrate 24 and the pointed tip 10, both laterally in the X,Y plane and in the Z-direction.

Pointed tip 10 is comprised of a conducting material, or a conductive coating layer, as is the spring-like cantilever 12. Suitable materials for the pointed tip 10 include a metal such as tungsten, or a highly doped conductive semiconductor material, such as a boron-doped silicon member which can be machined in very precise dimensions, or boron-doped diamond. The cantilever 12 can be comprised of a conducting metal, such as gold, or a highly doped silicon semiconductor. The advantage of using a doped semiconductor is that micromachining techniques can be utilized to provide an integral pointed tip 10-cantilever 12 using known lithographic techniques. Examples of such techniques are shown in U.S. Pat. No. 4,668,865 and the references described therein. This patent is incorporated herein by reference with respect to its teaching of a semiconductor pointed tipcantilever structure.

The dimensions of the pointed tip 10 are also well known in the art, wherein a tip having a radius of a curvature of about 1 nm can be obtained. This type of tip is described in U.S. Pat. No. 4,668,865, and in U.S. Pat. Nos. 4,724,318 and 4,343,993. A suitable example of a X-Y positioning technique utilizing piezoelectric elements is shown in more detail in U.S. Pat. No. 4,422,002 as well as in IBM Technical Disclosure Bulletin, Vol. 27, No. 10B, page 5976 (1985).

While a tunneling current is not required in the present invention, it may be advantageous to provide vibration attenuation devices if the pointed tip is to be carried at very close distances (in the nm range) from the insulator surface. Various attenuation devices have been described in the aforementioned references, and also in IBM Technical Disclosure Bulletin, Vol. 27, No. 5, page 3137 (1984).

The apparatus of FIG. 1 can be used to affect an insulating layer 26 to provide fine-line depositions thereon, or etching of fine-line patterns in the insulator 26. It is not necessary to have a tunneling current between pointed tip 10 and substrate 24, and it is therefore not necessary to provide a substrate including a highly conducting current return path. Because of this, any type of insulator can be used as the work piece, where such insulators include electron-sensitive resist materials and other non-electron-sensitive materials, such as quartz, polymers, and typical insulating materials such as silicon dioxide and silicon nitride. Depending on the separation between the pointed tip 10 and the surface of the insulator 26, low voltage electrons can be produced which will travel to the surface of the insulator 26. These electrons will be produced when a voltage is applied from source 20, utilizing the switch S. When the separation between the pointed tip 10 and the surface of insulator 26 is increased to more than about 1 nm, field emission is used to emit electrons from the apex of pointed tip 10. It has been found that it will be possible to dissociate molecules on the surface of insulating layer 26 by bombardment with electrons having energies greater than about 5 eV. If the surface of insulator 26 is clean, then the molecules of certain gases will be disassociated at the clean surface. If there is a residue, such as H or F atoms or molecules on the surface on insulator 26, a higher electron energy (greater than 30 eV) will be required to desorb these atoms or molecules. In such a situation, the voltage V applied to the pointed tip is increased so that electrons in the beam emitted from the apex of tip 10 will have electron energies greater than about 30 eV. Once the H or F residue is removed, further reactions desired at the surface of insulator 26 can be achieved.

Various embodiments will be shown wherein the invention can be used to expose a thick resist layer or a thin resist layer located on an underlying thick insulating substrate, for example to manufacture an X-ray mask. Other embodiments will illustrate the use of the apparatus of FIG. 1 to deposit fine-line patterns on insulators and to etch fine-line regions in an insulator layer.

Figure 2A:
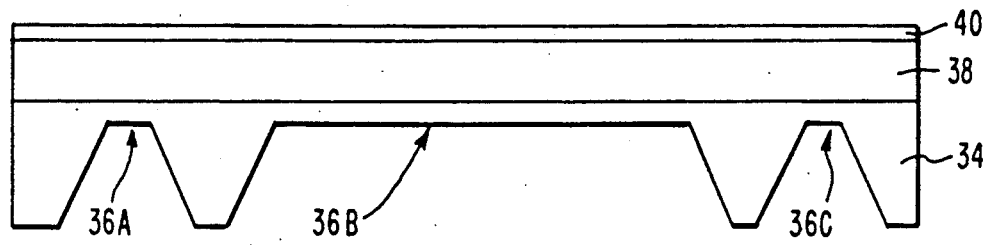
FIG. 2A–2C illustrate a particular use of this invention to pattern-wise expose an electron-sensitive resist layer in a process wherein an X-ray mask is formed.
Figure 2B:
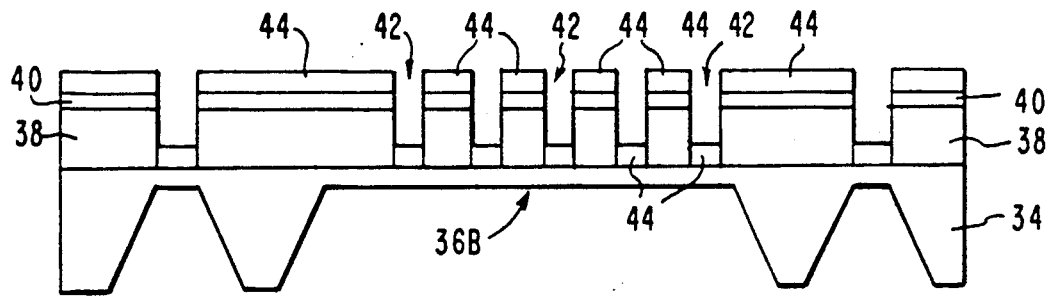
Figure 2C:
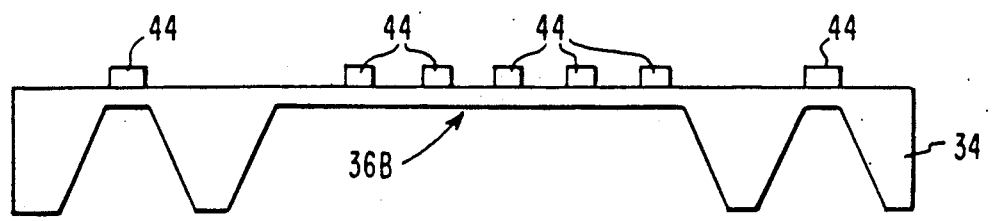

FIGS. 2A-2C illustrate some steps in the manufacture of an X-ray mask. In FIG. 2A, a thick (approximately 500 microns) silicon layer 34 has been doped and etched using the openings in the thin resist layer 40 as a mask to provide regions 36A, 36B, and 36C of lesser thickness. A two-layer resist is located over the silicon layer 34, comprising a thick resist layer 38 and a thin layer resist layer 40. These resist layers are to be patterned for the selective deposition of an X-ray opaque material, such as a thick layer of gold.

In FIG. 2B, the thin resist layer 40 is exposed to electrons from pointed tip 10, after which it is developed to leave openings therein. The thick resist layer 38 (to be used to provide a sufficiently thick gold layer) is then anistropically etched using the openings in the thin resist layer 40 as a mask to provide openings 42 which extend to the surface of silicon layer 34. An X-ray opaque material, such as gold layer 44, is then deposited onto the patterned resist layers, and onto the exposed surfaces of silicon layer 34, as shown in FIG. 2B.

After a lift-off process which removes the resist layers 38 and 40, as well as the gold layer located thereon, the structure of FIG. 2C is obtained. This structure includes patterned gold layer 44 located on the silicon layer 34, where the silicon regions 36 are sufficiently thin that X-rays will pass therethrough unless blocked by the gold layer 44. Thus, a structure is provided in which very fine gold layer patterns are produced by electron beam techniques but wherein high voltages are not required to focus the electron beam. Further, the pointed tip of FIG. 1 can be used to provide the narrow electron beam at low voltage, even though no highly conductive return current path is required. Since the entire thick resist layer 38 is insulating, the fine structure of FIG. 2C cannot be provided at low electron beam energies with apparatus existing prior to this invention.

Figure 3:
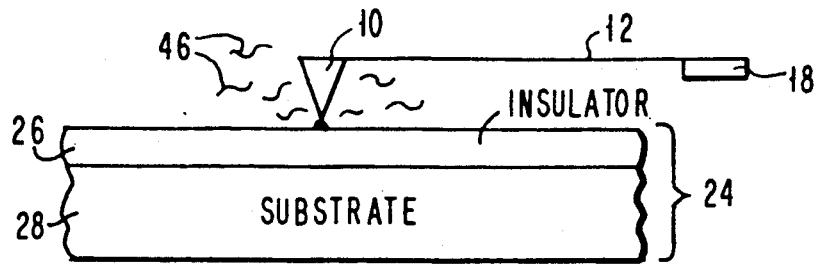
FIG. 3 illustrates the use of this invention in a direct-write mode wherein fine line depositions are produced on an insulating substrate.

FIG. 3 illustrates the use of the present invention to provide a fine-line deposition directly on an insulating substrate in a direct-write process. This technique has some similarities to that shown in U.S. Pat. No. 4,550,257, but is significantly different in that the substrate does not provide a highly conducting current return path between the pointed tip 10 and the substrate. For ease of illustration, the same reference numerals will be used as were used in FIG. 1, if the referenced feature has the same function. In FIG. 3, the layer 26 may be an insulator which is not a resist layer. A gas, indicated by the wavy lines 46, is located in the vicinity of the pointed tip 10, and is present between the apex of the pointed tip and the insulation surface 26. When a voltage is applied from source 20 (FIG. 1) field emission can be used to create electrons which travel to the insulator surface and dissociate or decompose gas molecules located on or near the surface of insulator 26. This causes materials to be deposited from the dissociated gas molecules. An example is a gas such as tungsten hexafluoride ($WF_6$) or boron trifluoride ($BF_3$). Other gases that can be used to deposit metals include trimethyl aluminum $Al(CH_3)_3$ and tungsten hexacarbonyl $W(CO)_6$. It is also possible to deposit other than metals on the surface of insulator 26 using the present invention. For example, a gas such as disilane ($Si_2H_6$) can be dissociated to deposit silicon.

Figure 4A:
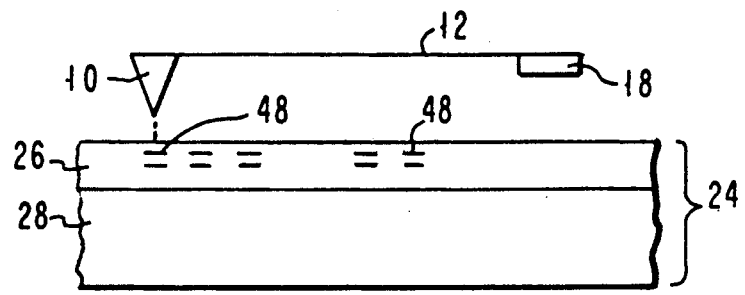
FIGS. 4A and 4B illustrate an additional use of this invention in which localized charged regions of an insulator can be contacted to produce localized etched regions in the insulator surface.
Figure 4B:
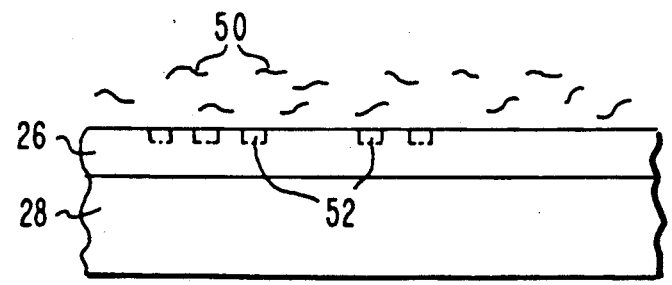

FIGS. 4A and 4B illustrate a technique in which the apparatus of FIG. 1 is used to etch very fine regions in the surface of the insulator 26. In this embodiment, the electrons emitted from pointed tip 10 cause a negative charging of localized regions in the surface of insulator 26, as illustrated by the "minus" marks 48. By scanning pointed tip 10 across the surface of insulator 26, localized trapping of the electrons occurs in the surface of layer 26. If an oppositely charged gas, plasma or particle cloud, indicated by wavy lines 50 in FIG. 4B, is brough to the surface of layer 26, the localized charged areas can be etched to produce the fine-line etched regions 52. An example of an oppositely charged gas or particle cloud which can be used to etch a negatively charged region in an insulator is $(CF_3)^+$.

As an alternative in the technique illustrated in FIGS. 4A and 4B, the oppositely charged gas or particle cloud can be one which will react with the localized charged regions 48 to cause decomposition or dissociation of the gas or particle cloud a deposit a species only in the area showing the localized charges. An example of such a charged gas is $(WF_5)^+$).

It will be recognized by those of skill in the art that charging of the surface of an insulator may not be desired in all cases. In order to eliminate accumulated electrons, the polarity of the voltage source 20 (FIG. 1) can be changed to attract any charging electrons located on the insulator surface. Thus, the net charge transferred to the insulator surface over time may be zero.

In the practice of this invention, it has been found that the applied voltages can be very small, typically less than 100 volts, and more typically less than about 40 volts. Because the electron beam is so narrow and because only low voltage electrons need be utilized, problems associated with conventional electron apparatus such as a scanning electron microscope (SEM) are avoided. Further, the limitations attendant with a scanning tunneling microscope type of apparatus, as utilized in aforementioned U.S. Pat. Nos. 4,550,257 and 4,785,189, are avoided since a tunneling current and a higly conducting current return path are not required. The pointed tip of this invention can be used to provide high resolution patterns on insulating substrates with resolutions not obtainable by conventional SEM-type apparatus. For example, a 5000 V SEM cannot expose a resist layer with a resolution of 100 Å because the electron beam cannot be focussed to 100 Å at these voltages. In the apparatus of the present invention however, a tip voltage of 5000 V can be used to expose a resist layer with 100 Å resolution.

In contrast with a conventional STM, the present invention can be used to scan an insulating substrate where the impedance of the entire current path is very high, being about $10^{10}$ ohms and larger. With a conventional STM, the current necessary for feedback control having scanning would not be obtainable when the current path has these high impedances.

While the invention has been shown with respect to particular embodiments thereof, it will be apparent to those of skill in the art that variations can be made therein without departing from the spirit and scope of the present invention. For example, those of skill in the art will foresee additional applications of this technique to produce many different structures, some of which may be novel.

Having thus described our invention what we claim as new and desire to secure as Letters Patent, is:

1. A method for producing fine linewidth patterns on an insulating substrate, comprising the steps of:
   bringing to close proximity an insulating substrate and a pointed tip, said pointed tip being connected to a spring-like cantilever and electrically connected to a voltage source,
   applying a voltage of said pointed tip to emit electrons therefrom, said electrons traveling to said insulator and affecting molecules at the surface or within said insulator, there being no highly conducting return path for said electrons through said insulating substrate, and
   moving said pointed tip and said substrate relative to one another to scan said tip across said substrate to thereby expose different areas of the substrate surface to said electrons.

2. The method of claim 1, where said insulating substrate includes a thick electron or ion sensitive resist layer.

3. The method of claim 1, including the further step of applying a voltage of opposite polarity to said pointed tip to remove or neutralize charge on the surface of said insulating substrate.

4. The method of claim 1, including the step of providing a cloud of gas molecules between said pointed tip and said insulating substrate, or on said insulating substrate said gas molecules being decomposable or dissociable by electrons or ions emitted from said pointed tip.

5. A method for producing fine linewidth patterns on an insulating substrate, including the following steps:
   bringing to close proximity an insulating substrate and a conductive pointed tip, said pointed tip being connected to a spring-like cantilever and a voltage source.
   emitting electrons from said pointed tip by applying a voltage thereto, affecting molecules at the surface or within said insulator there being no highly electrically conductive return path for said electrons through said substrate, said electrons traveling to said substrate and producing a negatively charged localized region on the surface of said substrate.
   exposing said negatively charged localized region to a positively charged gas or particle cloud,
   reacting said positively charged gas or particle cloud at said localized negatively charged region of said substrate surface to etch said insulator layer at said charged region to produce a fine linewidth recess in said insulator,
   moving said pointed tip and said insulating substrate relative to one another and repeating said steps to create another fine linewidth recess in the surface of said insulator.

6. A method for producing a fine linewidth pattern on the surface of an insulating substrate, including the following steps:
   bringing to close proximity an insulating substrate and a conductive pointed tip, said pointed tip being connected to a conductive spring-like cantilever and to a voltage source,
   applying a voltage to said pointed tip to emit electrons therefrom, said electrons traveling from said pointed tip to said insulating substrate and affecting molecules at the surface or within said insulator, there being no highly electrically conductive path for electrons through said substrate,
   exposing a localized region of the surface of said insulating substrate to said electrons to produce a local negatively charged region of said insulator,
   exposing said negatively charged localized region to a positive gas or particle cloud, reacting said positive gas or particle cloud at said negatively charged localized region to deposit a constituent of said gas or particle cloud at said localized region to thereby produce a fine linewidth pattern, providing relative motion between said insulating substrate and said pointed tip and repeating the heretofore mentioned steps to create a fine linewidth pattern at another location on said insulator substrate.

7. An apparatus for exposure of a nonconductive, electron-sensitive resist layer located on an insulating substrate, comprising the following components:

a conductive pointed tip connected to a conductive spring-like cantilever, a voltage source electrically connected to said pointed tip through said cantilever, displacement means for producing relative motion between said pointed tip and said insulating substrate, means for activating said voltage source to produce a fine linewidth pattern of electrons emanating from said pointed tip, said electrons traveling to said insulating substrate and affecting molecules at the surface or within said insulator, there being no highly conducting electrical return path for said electrons through said insulating substrate, and means for adjusting the distance between said pointed tip and said insulating substrate.

8. The apparatus of claim 7, where said resist layer is at least 50 Å thick.

9. The apparatus of claim 7, where said substrate is comprised of a first thin electron-sensitive resist layer and a second thick resist layer.

10. The apparatus of claim 7, where said pointed tip and said spring-like cantilever are portions of a single doped semiconductor material.

11. The apparatus of claim 10, where said doped semiconductor is silicon.

12. The apparatus of claim 7, where said pointed tip is a semiconducting diamond.

13. In combination, a pointed tip of nanometer radius sharpness, said tip being comprised of a conductive material, a conductive, spring-like cantilever connected to said pointed tip, a voltage source connected to said cantilever for providing a voltage at said pointed tip, applying a voltage to said pointed tip to emit electrons therefrom, said electrons traveling to an insulating substrate and affecting molecules at the surface or within said insulator, there being no highly conducting return path for said electrons through said insulating substrate, displacement means for producing relative motion between said pointed tip and said substrate to scan said tip relative to said substrate in an X-Y plane, further displacement means for producing relative motion in a Z-direction between said tip and said substrate to vary the tip-to-substrate distance to thereby establish the Z coordinate of said pointed tip for succession of X-Y displacements.

14. The combination of claim 13, where said pointed tip and said cantilever are an integral unit of the same material.

15. The combination of claim 14, where said material is a doped semiconductor.

16. The combination of claim 15, where said semiconductor is chosen from the group consisting of silicon and diamond.

17. The combination of claim 13, where the circuit impedance of said insulating substrate conductive tip and conductive spring-like cantilever is greater than about $10^{10}$ ohms.

18. The combination of claim 13, where said substrate includes a layer of ion or electron sensitive resist.

19. The combination of claim 13, where said pointed tip is spaced from the surface of said substrate and has a sufficient voltage thereat to cause field emission of electrons from said pointed tip.

20. The combination of claim 19, where said substrate includes an electron-sensitive resist layer which is exposed by said electrons.

* * * * *